US008013348B2

(12) United States Patent
Kishioka

(10) Patent No.: US 8,013,348 B2
(45) Date of Patent: Sep. 6, 2011

(54) SEMICONDUCTOR DEVICE WITH A DRIVER CIRCUIT FOR LIGHT EMITTING DIODES

(75) Inventor: Toshiki Kishioka, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 119 days.

(21) Appl. No.: 11/787,084

(22) Filed: Apr. 13, 2007

(65) Prior Publication Data

US 2007/0241349 A1 Oct. 18, 2007

(30) Foreign Application Priority Data

Apr. 14, 2006 (JP) ................................ 2006-111936

(51) Int. Cl.
*H01L 33/00* (2010.01)

(52) U.S. Cl. ............ 257/88; 257/773; 257/775; 257/84

(58) Field of Classification Search .................. 257/116, 257/117, 432–437, 749, 257, 258, 252–254, 257/79–103, 773, 775
See application file for complete search history.

(56) References Cited

U.S. PATENT DOCUMENTS 5,023,689 A * 6/1991 Sugawara ..................... 257/372
5,406,312 A * 4/1995 Arimoto ....................... 345/205
5,499,131 A * 3/1996 Kim ............................. 349/149
5,898,276 A * 4/1999 Tsuruoka et al. .......... 315/169.3
5,914,763 A * 6/1999 Fujii et al. ..................... 349/149
6,462,423 B1 * 10/2002 Akram et al. ................. 257/778
6,535,235 B1 * 3/2003 Nagumo ....................... 347/237
6,634,736 B2 * 10/2003 Miyakoshi et al. ............ 347/57
6,686,615 B1 * 2/2004 Cheng et al. .................. 257/208
6,713,879 B2 * 3/2004 Akram et al. ................. 257/778
6,717,604 B2 * 4/2004 Nagumo ....................... 347/237
7,068,338 B2 * 6/2006 Taguchi et al. ............... 349/149
7,267,555 B2 * 9/2007 Huang et al. ..................... 439/74
7,522,145 B2 * 4/2009 Lee et al. ...................... 345/100
2004/0239863 A1 * 12/2004 Liou et al. ..................... 349/152
2006/0044237 A1 * 3/2006 Lee et al. ........................ 345/82
2007/0290603 A1 * 12/2007 Ishizuka et al. ............... 313/498

FOREIGN PATENT DOCUMENTS

JP 2-224370 9/1990
JP 5-8444 1/1993
JP 5-72563 3/1993
JP 3212812 7/2001
JP 2004-14798 1/2004
JP 2006256152 A * 9/2006

* cited by examiner

*Primary Examiner* — Leonardo Andújar
*Assistant Examiner* — Jordan Klein
(74) *Attorney, Agent, or Firm* — Cooper & Dunham LLP

(57) ABSTRACT

A novel semiconductor device includes a plurality of light emitting diodes, a plurality of transistors, a source pad, and a plurality of wires. The plurality of transistors drive the plurality of light emitting diodes. The source pad is connected to sources of the plurality of transistors and supplies an electric current to each of the plurality of transistors. The plurality of wires connect the source pad and the sources of the plurality of transistors. The plurality of wires also provide substantially equal resistance to the electric current passing therethrough.

20 Claims, 5 Drawing Sheets

Prior Art

Prior Art

Prior Art

SEMICONDUCTOR DEVICE WITH A DRIVER CIRCUIT FOR LIGHT EMITTING DIODES

BACKGROUND

1. Technical Field

This disclosure relates to a semiconductor device, and more particularly to a semiconductor device with a driver circuit capable of supplying electricity to a plurality of light emitting diodes.

2. Discussion of the Background

Recent advances in semiconductor technology have led to development and application of enhanced light emitting diodes (LEDs). Particularly, developments of LEDs with increased brightness and blue LEDs have expanded the use of LED technology.

LEDs with high brightness are used in various illumination devices, for example, liquid crystal display (LCD) backlighting and indicator lamps for automobiles. The development of blue LEDs has made possible a full color display using red-green-blue (RGB) LEDs.

Typically, an LED device for illumination or display contains a plurality of LEDs. For example, an LCD panel uses a plurality of white or multi-color LEDs for backlighting. Such an LED device includes an LED driver circuit that serves to control an electric current supplied to drive the plurality of LEDs (hereinafter referred to as drive currents).

FIG. 1 is a layout diagram illustrating a background LED driver circuit 200. The circuit 200 includes a first transistor array A1, a second transistor array A2, wires 201, 202, 203, 204, 205, and 206, connection pads 221, 222, 223, 224, 225, and 226, a pair of source pads 231 and 232, and thick wires 233, 234, and 235.

The first transistor array A1 is disposed substantially along one side of the circuit 200, including a first transistor 211, a second transistor 212, a third transistor 213, and a fourth transistor 214. The second transistor array A2 is disposed substantially along another side of the circuit 200, including a fifth transistor 215 and a sixth transistor 216. The transistors 211 through 216 may be N-channel metal oxide semiconductor (NMOS) transistors, for example, for driving a plurality of LEDs (not shown).

The plurality of LEDs are respectively connected to the corresponding drains of the transistors 211 through 216 via the connection pads 221 through 226.

The pair of source pads 231 and 232 are located between the forth transistor 214 and the fifth transistor 215 and coupled via the thick wire 233.

The wires 201 through 204 respectively connect sources of the first through fourth transistors 211 through 214 to the thick wire 234 extending along the first transistor array A1. The wires 205 and 206 respectively connect sources of the fifth and sixth transistors 215 and 216 to the thick wire 235 extending along the second transistor array A2.

The thick wire 234 is connected with the source pad 231, and the thick wire 235 is connected with the source pad 232.

An electric current for each of the plurality of LEDs is supplied from one of the pair of source pads 231 and 232. The electric current passes through one of the thick wires 234 and 235 to flow in one of the transistors 211 through 216 via corresponding one of the wires 201 through 206. The electric current is then supplied to corresponding one of the plurality of LEDs via corresponding one of the connection pads 201 through 206.

Referring to FIG. 2, an exemplary circuit diagram of the background LED driver circuit 200 of FIG. 1 is described. In FIG. 2, the circuit 200 includes LEDs D201 through D206, the first through sixth transistors 211 through 216, the connection pads 221 through 226, first resistors R11$a$ through R16$a$, second resistors R21$a$ through R26$a$, the pair of source pads 231 and 232, a power supply Vdd, and a bias terminal Vb.

The power supply Vdd is connected to anodes of the LEDs D201 through D206, and the connection pads 221 through 226 are respectively connected to cathodes of the LEDs D201 through D206.

The bias terminal Vb is connected to gates of the transistors 211 through 216, which are biased at a bias voltage $V_b$. The power supply Vdd provides each of the LEDs D201 through D206 with a drain current corresponding to the bias voltage $V_b$.

The first resistors R11$a$ through R16$a$ and the second resistors R21$a$ through R26$a$ both represent wire resistance. The wire resistance is an electrical resistance of a wire material (e.g., a metal material) used to form the circuitry.

Namely, in FIGS. 1 and 2, the first resistors R11$a$ through R16$a$ represent wire resistance associated with the wires 211 through 216. The second resistors R21$a$ through R26$a$ represent wire resistance associated with the thick wire 234.

Even though the first and second resistors R11$a$ through R16$a$ and R21$a$ through R26$a$ have relatively low resistance in general, the wire resistance causes voltage drop when an electric current of, for example, several hundred milliamperes passes through wire.

The voltage drop across each of the first and second resistors R11$a$ through R16$a$ and R21$a$ through R26$a$ affects gate-source voltage of the transistors 211 through 216, which is closely related to drain current of each transistor.

In the circuit 200, the drain current of each of the transistors 211 through 216 is the drive current supplied to drive each of the LEDs D201 through D206. Therefore, the wire resistance as represented by the first and second resistors R11$a$ through R16$a$ and R21$a$ through R26$a$ is related to the brightness of the LEDs D201 through D206.

In the circuit 200, the wire resistance represented by each of the resistors R11$a$ through R16$a$ varies depending on length and width of each wire. The wires 201 through 206 have an extremely short, substantially common length and width, such that the first resistors R11$a$ through R16$a$ have a substantially same low resistance to each other. Since each of the wires 201 through 206 carries an amount of electric current supplied to corresponding one of the LEDs D201 through D206, the voltage drop across each wire is substantially identical to each other.

On the other hand, the thick wires 234 and 235 have relatively high resistance due to wire length. The resistance represented by the second resistors R21$a$ through R26$a$ is several or several dozen times more than the resistance represented by the first resistors R11$a$ through R16$a$.

The thick wire 234 carries electric currents supplied to the LEDs D201 through D204 and the thick wire 235 carries electric currents supplied to the LEDs D205 and D206. Even though the resistance of the thick wires 234 and 235 represented by the resistors R21$a$ through R26$a$ is substantially uniform, the voltage drop varies according to the distance from the source pad, i.e., the resistor nearer to the source pad causes a higher voltage drop.

In addition, the number of resistors through which the electric current for one of the LEDs D201 through D206 passes varies depending on the position of the transistor in relation to the corresponding source pad.

In FIG. 2, the electric current supplied to one of the LEDs D201 through D204 passes through corresponding one of the first resistors R11$a$ through R14$a$ and at least one of the second resistors R21$a$ through R24$a$ to flow in the source pad 231. Similarly, the electric current supplied to one of the LEDs D205 and D206 passes through corresponding one of the first resistors R15$a$ and R16$a$ and at least one of the second resistors R25$a$ and R26$a$ to flow in the source pad 232.

For example, the electric current supplied to drive the LED D201 passes through five resistors, i.e., the first resistor R11$a$ and the second resistors R21$a$ through R24$a$, to flow in the source pad 231. The electric current supplied to drive the LED D204 passes through two resistors, i.e., the first resistor R14$a$ and the second resistor R24$a$, to flow in the source pad 231.

Therefore, two factors cause fluctuations in the brightness of the LEDs D201 through D206 in the driver circuit 200. The variation in number of resistors through which the drive current passes, together with the variation in voltage drop provided by each resistor, translates into the variation in drive current, which results in the differences in the brightness of the LEDs D201 through D206.

The differences in the brightness of the plurality of LEDs or non-uniformity in LEDs intensity may affect performance of the LED device, degrading display quality and/or color reproducibility. The non-uniformity in LEDs intensity may be reduced by accurately providing drive currents of equal intensity to the plurality of LEDs.

An approach to reduce the variation in drive current is to directly connect each transistor to a corresponding source pad using a separate wire. Such an approach may simplify the driver circuit by removing resistors through which electric currents for different destinations commonly flow, that is, the thick wires 234 and 235 of FIG. 1.

FIG. 3 is a layout diagram illustrating another background LED driver circuit 300. The driver circuit 300 includes a first transistor array B1, a second transistor array B2, wires 301, 302, 303, 304, 305, and 306, connection pads 321, 322, 323, 324, 325, and 326, a pair of source pads 331 and 332, and a thick wire 333.

The first transistor array B1 includes a first transistor 311, a second transistor 312, a third transistor 313, and a fourth transistor 314. The second transistor array B2 includes a fifth transistor 315 and a sixth transistor 316. The transistors 311 through 316 may be NMOS transistors, serving as drives for LEDs (not shown).

In the circuit 300, components including the transistors 311 through 316, the connection pads 321 through 326, the pair of source pads 331 and 332, and the thick wire 333 are located in a similar manner as in the circuit 200.

The wires 301 through 304 respectively connect sources of the first through fourth transistors 311 through 314 to the source pad 331. The wires 305 and 306 respectively connect sources of the fifth and sixth transistors 315 and 316 to the source pad 332.

The wires 301 through 306 are of substantially uniform width. Each wire has a particular length corresponding to the distance between the corresponding transistor and the source pad connected thereto. Consequently, there exists a variation in wire resistance due to the varying lengths between the wires 301 through 306, resulting in the variation in drive current for the plurality of LEDs.

To reduce variation in performance among a plurality of electric components in a semiconductor device, various background techniques have been proposed.

In a semiconductor integrated circuit (IC) device that employs one of these techniques, a signal source supplies clock signals to a plurality of circuits with a common wire whose width decreases with relative distance from the signal source. As the resistance increases with the decreasing width of the common wire, the variation in voltage may be reduced to a certain degree while slight differences of voltage are not completely removed.

In a pattern layout method for an LCD panel that employs another technique, terminals are connected by through-holes and wires with common resistance. Such a pattern layout method is configured to regulate time delay within a driver circuit, in which the variation in brightness of multiple LEDs still remains unsolved.

BRIEF SUMMARY

This patent specification describes a novel semiconductor device which can provide a substantially uniform electric current to a plurality of light emitting diodes.

In one example, a novel semiconductor device includes a plurality of light emitting diodes, a plurality of transistors, a source pad, and a plurality of wires. The plurality of transistors are configured to drive the plurality of light emitting diodes. The source pad is connected to sources of the plurality of transistors and is configured to supply an electric current to each of the plurality of transistors. The plurality of wires are configured to connect the source pad and the sources of the plurality of transistors. The plurality of wires are further configured to provide substantially equal resistance to the electric current passing therethrough.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
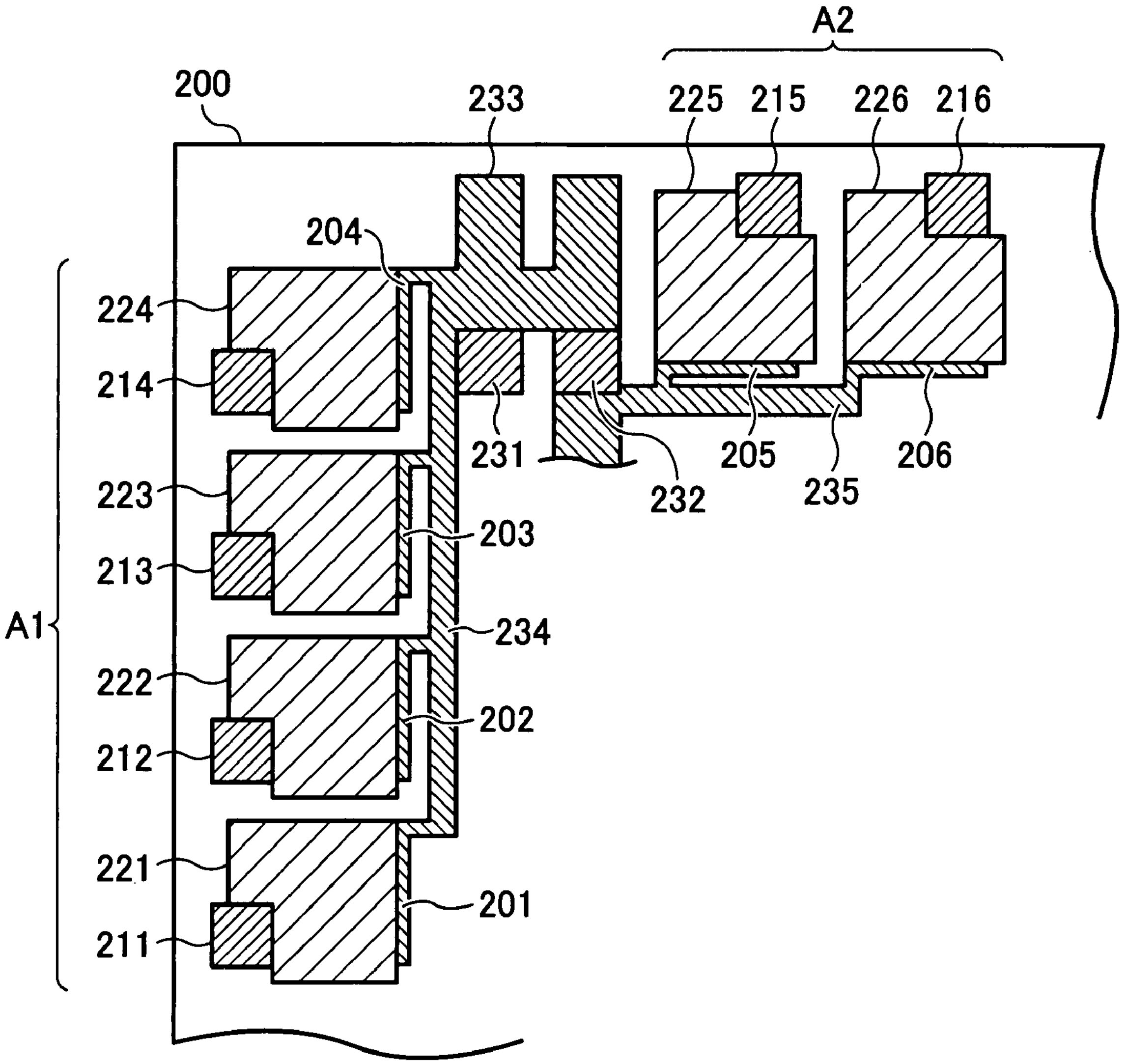
FIG. 1 is a layout diagram illustrating a background driver circuit for light emitting diodes.
Figure 2:
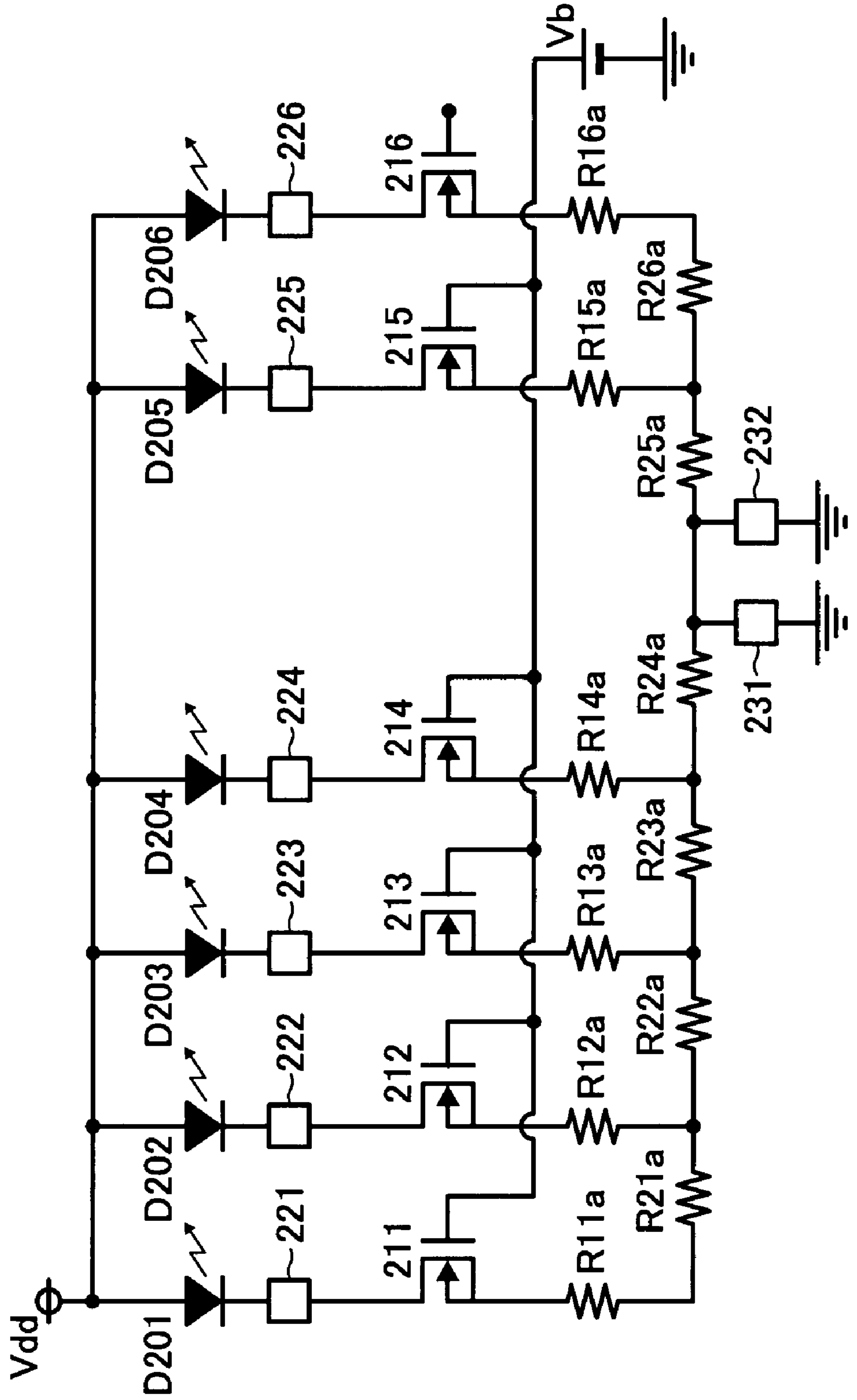
FIG. 2 is an exemplary circuit diagram of the background driver circuit for light emitting diodes of FIG. 1.
Figure 3:
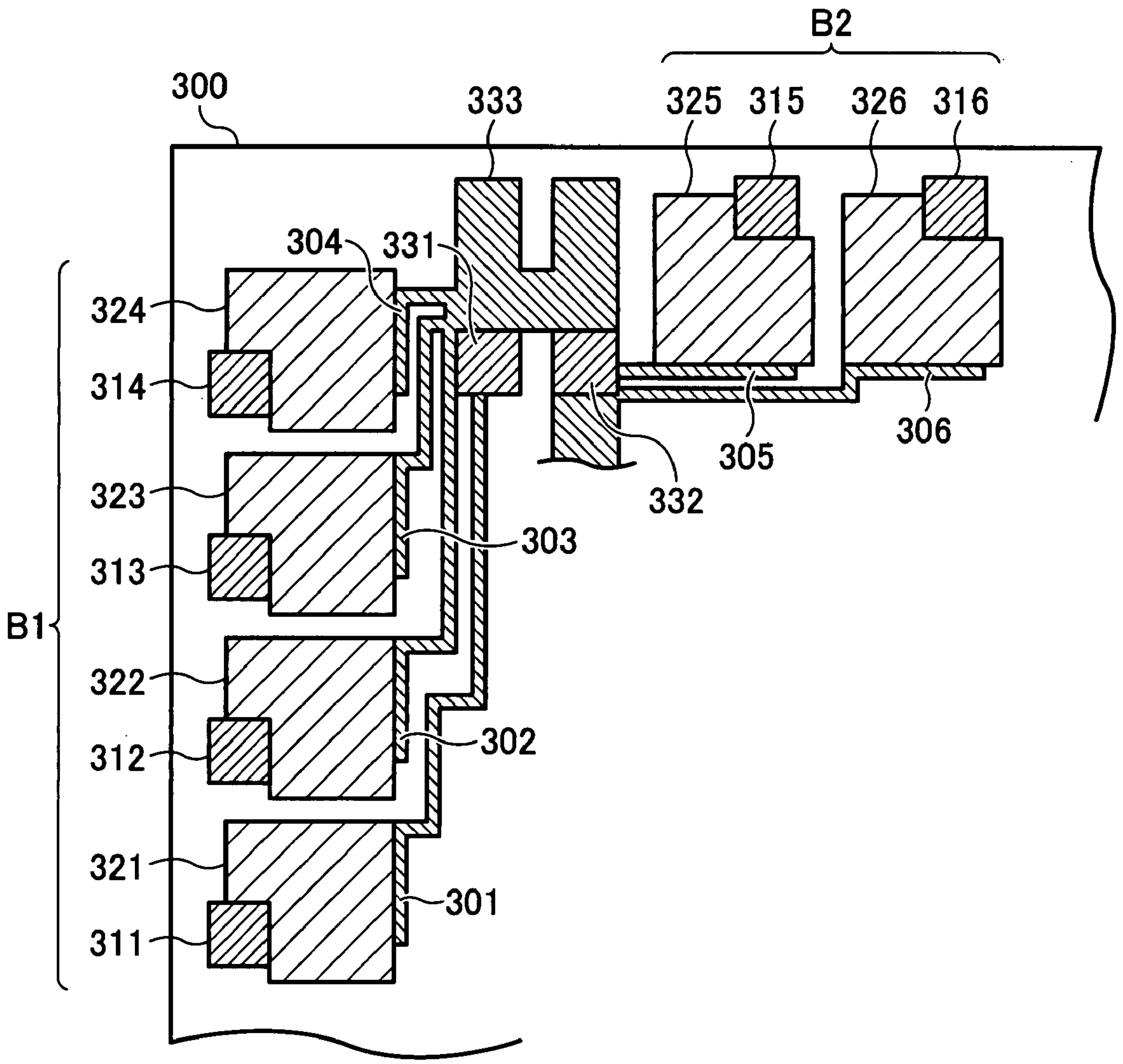
FIG. 3 is a layout diagram illustrating another background driver circuit for light emitting diodes.
Figure 4:
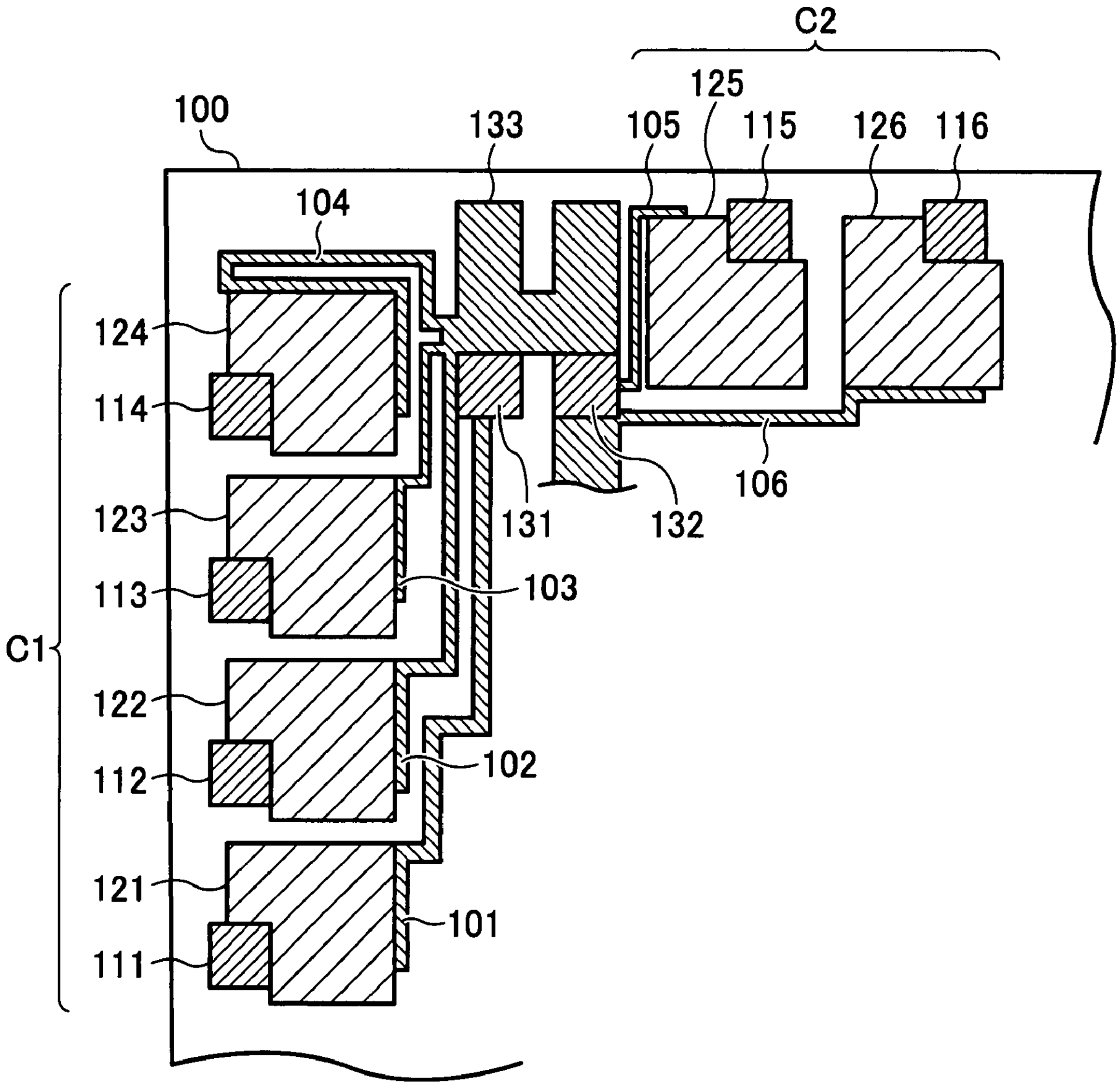
FIG. 4 is a layout diagram illustrating a driver circuit for light emitting diodes according to a preferred embodiment disclosed in this patent specification.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to FIG. 4, a driver circuit 100 for light emitting diodes (LEDs) of a semiconductor device according to a first preferred embodiment is described.

FIG. 4 illustrates an exemplary layout diagram of the LED driver circuit 100.

The driver circuit 100 includes a first transistor array C1, a second transistor array C2, wires 101, 102, 103, 104, 105, and 106, connection pads 121, 122, 123, 124, 125, and 126, a pair of source pads 131 and 132, and a thick wire 133.

The first transistor array C1 is disposed substantially along one side of the circuit 100, including a first transistor 111, a second transistor 112, a third transistor 113, and a fourth transistor 114. The second transistor array C2 is disposed substantially along another side of the circuit 100, including a fifth transistor 115 and a sixth transistor 116. The transistors 111 through 116 may be N-channel metal oxide semiconductor (NMOS) transistors of substantially uniform size and characteristics, serving as drives for a plurality of LEDs (not shown). Alternatively, P-channel MOS transistors may be used according to the intended purpose.

The plurality of LEDs are respectively connected to the corresponding drains of the transistors 111 through 116 via the connection pads 121 through 126. The pair of source pads 131 and 132 are located between the forth transistor 114 and the fifth transistor 115 and coupled via the thick wire 133.

The first through fourth wires 101 through 104 respectively connect sources of the first through fourth transistors 111 through 114 to the source pad 131. The fifth and sixth wires 105 and 106 respectively connect sources of the fifth and sixth transistors 115 and 116 to the source pad 132.

An electric current for each of the plurality of LEDs is supplied from one of the pair of source pads 131 and 132 to flow in one of the transistors 111 through 116 via corresponding one of the wires 101 through 106. The electric current is supplied to one of the plurality of LEDs via corresponding one of the connection pads 121 through 126.

Each of the wires 101 through 106 has a particular wire length and a particular wire width. The wire length is a length of wire between the transistor and the corresponding source pad. The wire width is a width of wire. Each of the wires 101 through 106 has a particular wire resistance to passage of the electric current in accordance with the particular wire length and the particular wire width.

Given that the wires 101 through 106 are formed of a metal material with a substantially same thickness, values of the wire resistance $R_1$, $R_2$, $R_3$, $R_4$, $R_5$, and $R_6$ for the wires 101, 102, 103, 104, 105, and 106, respectively, are defined by the following equation:

$$R=R_s \cdot L/W \quad [1]$$

where "$R_s$" represents wire resistance per unit area of surface, "L" represents the wire length, and "W" represents the wire width.

The wire resistance R is adjusted by increasing or decreasing the wire length L and/or the wire width W. In the circuit 100, the wires 101 through 106 have particular wire lengths $L_1$, $L_2$, $L_3$, $L_4$, $L_5$, and $L_6$ and particular wire widths $W_1$, $W_2$, $W_3$, $W_4$, $W_5$, and $W_6$, respectively, such that values of the wire resistance $R_1$, $R_2$, $R_3$, $R_4$, $R_5$, and $R_6$ are substantially identical.

To determine the wire length L and the wire width W for each of the wires 101 through 106, the wire length L and the wire width W of a wire connected to a transistor farthest from the source pad are first determined. The wire width W is determined to be within a reasonable range within the constraints of design rules for a particular circuit layout and electrical parameters.

For example, the wire width $W_1$ and the wire length $L_1$ of the wire 101 connecting the first transistor 111 and the source pad 131 are first determined to obtain the resistance $R_1$. The wire length L and the wire width W for each of the other wires are determined in accordance with the layout of the components such that the resistance R is substantially identical to $R_1$.

The wire 104 connecting the fourth transistor 114 to the source pad 131 may be extended to have the wire length $L_4$ such that the wire width $W_4$ is not less than a minimum limit determined by configuration of the driver circuit 100, such as design rule and maximum electric current applied to the wires.

For example, among the values of wire length $L_1$, $L_2$, $L_3$, and $L_4$, $L_1$ is largest, $L_2$ is second largest, and $L_3$ is least. Among the values of wire width $W_1$, $W_2$, $W_3$, and $W_4$, $W_1$ is largest, $W_2$ is second largest, and $W_3$ is least.

The value of $L_4$ may be set substantially equal to the value of $L_2$, for example. In this case, the values of $W_4$ and $W_2$ are substantially equal to each other. However, $L_4$ need not be equal to $L_2$, and $W_4$ need not be equal to $W_2$. The values of $L_4$ and $W_4$ may be arbitrarily defined in accordance with equation [1] and the configuration of the driver circuit 100.

Figure 5:
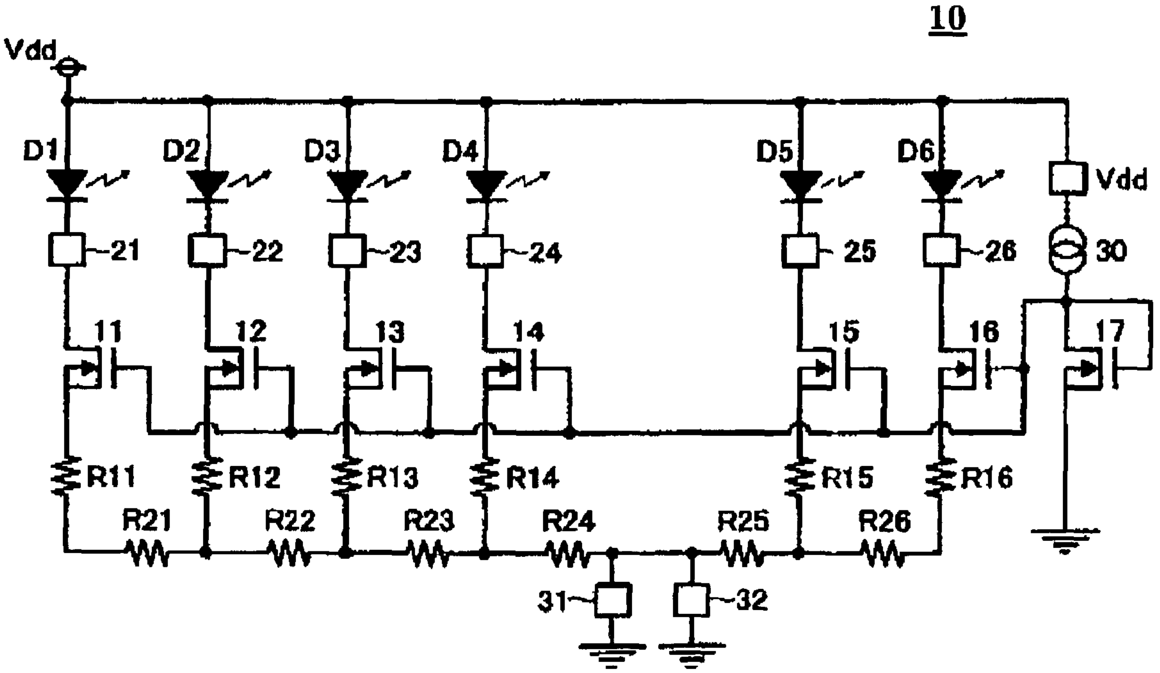
FIG. 5 is a circuit diagram of a driver circuit for light emitting diodes according to another embodiment disclosed in this patent specification.

Referring now to FIG. 5, an LED driver circuit 10 according to another preferred embodiment is described. FIG. 5 is a circuit diagram illustrating an example of the LED driver circuit 10.

The circuit 10 includes first through sixth LEDs D1, D2, D3, D4, D5, and D6 and first through sixth transistors 11, 12, 13, 14, 15, and 16. The circuit 10 also includes a small transistor 17, first through sixth connection pads 21, 22, 23, 24, 25, and 26, a constant current source 30, a pair of source pads 31 and 32, first resistors R11, R12, R13, R14, R15, and R16, second resistors R21, R22, R23, R24, R25, and R26, and a power supply Vdd.

The power supply Vdd is connected to anodes of the LEDs D1 through D6, and the connection pads 21 through 26 are respectively connected to cathodes of the LEDs D1 through D6. The connection pads 21 through 26 respectively connect the LEDs D1 through D6 with the transistors 11 through 16.

The small transistor 17 is a MOS transistor of the same conductivity type as the transistors 11 through 16. For example, when the transistors 11 through 16 are NMOS transistors, the MOS transistor 17 is also an NMOS transistor. The small transistor 17 has a size several dozen to several thousand times smaller than the size of the transistors 11 through 16.

The source of the small transistor 17 is grounded, and the drain of the small transistor 17 is connected to the power supply Vdd via the current source 30. The gate of the small transistor 17 is connected to the gates of the transistors 11 through 16. The gate and the drain of the small transistor 17 are connected.

The gates of the transistors 11 through 16 are biased at a bias voltage $V_b$. The power supply Vdd provides each of the LEDs D1 through D6 with a drive current corresponding to the bias voltage $V_b$. The amount of drive current supplied to each of the LEDs D1 through D6 is several dozen to several thousand times larger than the amount of electric current supplied by the current source 30.

The drive current supplied to one of the LEDs D1 through D4 passes through corresponding one of the first resistors R11 through R14 and at least one of the second resistors R21 through R24 to flow in the source pad 31. Similarly, the drive current supplied to one of the LEDs D5 and D6 passes through corresponding one of the first resistors R15 and R16 and at least one of the second resistors R25 and R26 to flow in the source pad 32. The number of resistors through which the drive current for one of the LEDs D1 through D6 passes varies depending on the position of the transistor in relation to the corresponding source pad.

The first resistors R11 through R16 and the second resistors R21 through R26 represent resistance provided by wires used to form the circuit 10. Values of resistance of the first and second resistors R11 through R16 and R21 through R26 are determined such that total resistance between each of the transistors 11 through 16 and the corresponding source pad is substantially equal to a constant $R_a$.

The values of resistance of the first resistors R11 through R16 and the second resistors R21 through R26 are defined to satisfy the following equations:

$$R_{11}+R_{21}=R_{12}$$

$$R_{12}+R_{22}=R_{13}$$

$$R_{13}+R_{23}=R_{14}$$

$$R_{16}+R_{26}=R_{15}$$

$$R_{14}+R_{24}=R_{15}+R_{25}=R_a$$

where $R_{11}$, $R_{12}$, $R_{13}$, $R_{14}$, $R_{15}$, and $R_{16}$ respectively represent the values of resistance of the first resistors R11, R12, R13, R14, R15, and R16, and $R_{21}$, $R_{22}$, $R_{23}$, $R_{24}$, $R_{25}$, and $R_{26}$ respectively represent the values of resistance of the second resistors R21, R22, R23, R24, R25, and R26.

Each of the transistors 11 through 16 has gate-source voltage which is substantially constant and independent of the electric current supplied to the LEDs D1 through D6. The values of resistance $R_{11}$ through $R_{16}$ may be controlled by any suitable means, e.g., varying length and/or width of the wires.

Shapes and locations of the components as described in the present specification are preferred examples of the semiconductor device according to the disclosure of this patent specification. However, the present invention is not limited to the examples described herein.

Numerous additional modifications and variations are possible in light of the above teachings. It is therefore to be understood that within the scope of the appended claims, the disclosure of this patent specification may be practiced otherwise than as specifically described herein.

This patent specification is based on Japanese patent application, No. JPAP2006-11936 filed on Apr. 14, 2006 in the Japanese Patent Office, the entire contents of which are incorporated by reference herein.

What is claimed is:

1. A semiconductor device, comprising:

a plurality of light emitting diodes;

a plurality of transistors having substantially uniform size and having sources and drains, the drains of the plurality of transistors being connected to respective ones of the plurality of light emitting diodes to drive said respective ones of the plurality of light emitting diodes;

a source pad connected to the sources of each of the plurality of transistors and configured to supply an electric current to the sources of each of the plurality of transistors;

a plurality of wires configured to connect the source pad and the sources of each of the plurality of transistors and to provide substantially equal resistance to the electric current passing from the source pad to the sources of each of the plurality of transistors; and a transistor of a reduced size relative to said plurality of transistors of substantially uniform size, the reduced size transistor having a gate and a drain connected together, the reduced size transistor providing a gate-source voltage generated by providing a constant current to the drain of the reduced size transistor as a bias voltage to gates of the plurality of transistors, wherein the gate of the reduced size transistor is connected to the gates of said plurality of transistors of substantially uniform size, wherein at least one of the plurality of transistors is closer to the source pad relative to another one of the plurality of transistors and a wire connecting said at least one closer transistor to the source pad is at least as long as a wire connecting said another one of the plurality of transistors to the source pad.

2. The semiconductor device according to claim 1, wherein the plurality of wires respectively connect the sources of the plurality of transistors to the source pad.

3. The semiconductor device according to claim 1, wherein each of the plurality of wires has a particular length and a particular width so that the resistance to the electric current passing through each of the plurality of wires is substantially equal.

4. The semiconductor device according to claim 3, wherein the particular width of a longest wire of the plurality of wires is largest.

5. The semiconductor device according to claim 3, wherein the particular length of a widest wire of the plurality of wires is largest.

6. The semiconductor device according to claim 1, wherein at least one of the plurality of wires is extended to increase the particular length thereof.

7. The semiconductor device according to claim 1, wherein the plurality of transistors have a substantially uniform size and substantially common characteristics.

8. The semiconductor device according to claim 1, wherein the gates of the plurality of transistors are connected in common, and the predetermined bias voltage is applied thereto to form a constant current circuit.

9. The semiconductor device according to claim 1, wherein each of the wires of said plurality of wires has a substantially constant respective width.

10. The semiconductor device according to claim 9, wherein each of the wires of said plurality of wires has a substantially constant thickness.

11. The semiconductor device according to claim 1, wherein each of the wires of said plurality of wires has a respective substantially constant cross-section.

12. The semiconductor device according to claim 11, wherein at least some of the wires of said plurality of wires differ in length and in cross-section but have substantially the same resistance to electric current.

13. The semiconductor device according to claim 1, wherein the resistance of each electrical path from the source pad to the sources of the plurality of transistors is substantially equal.

14. The semiconductor device according to claim 1, wherein the plurality of wires are each connected between the source pad and one of the sources of the plurality of transistors.

15. The semiconductor device according to claim 1, wherein at least two of the plurality of wires have substantially equal widths.

16. The semiconductor device according to claim 1, wherein at least two of the plurality of wires have substantially equal lengths.

17. The semiconductor device according to claim 1, wherein the source of the reduced size transistor is connected to ground, and the gate and the drain of the reduced size transistor are connected to a power supply via a constant current source.

18. The semiconductor device according to claim 1, wherein a drive current supplied from the drain of the reduced sized transistor, to the gates of the plurality of transistors of substantially uniform size, is several dozen to several thousand times larger than a current supplied from a constant current source connected to the drain of the reduced size transistor.

19. A semiconductor device, comprising:

a plurality of light emitting diodes;

a plurality of transistors having substantially uniform size and having sources and drains, the drains of the plurality of transistors being connected to respective ones of the plurality of light emitting diodes to drive said respective ones of the plurality of light emitting diodes;

a source pad connected to the sources of each of the plurality of transistors and configured to supply an electric current to the sources of each of the plurality of transistors;

a plurality of wires configured to connect the source pad and the sources of each of the plurality of transistors and to provide substantially equal resistance to the electric current passing from the source pad to the sources of each of the plurality of transistors; and a transistor of a reduced size relative to, and a same conductivity type as, the plurality of transistors of substantially uniform size, said reduced size transistor having a gate and a drain connected together, the reduced size transistor providing a gate-source voltage generated by providing a constant current to the drain of the reduced size transistor as a bias voltage to gates of the plurality of transistors of substantially uniform size, wherein the gate of the reduced size transistor is connected to the gates of said plurality of transistors of substantially uniform size.

20. The semiconductor device according to claim 19, wherein the reduced size transistor has a size several dozen to several thousand times smaller than a particular size of each of the plurality of transistors.

* * * * *